United States Patent
Otremba

(10) Patent No.: US 7,705,434 B2
(45) Date of Patent: Apr. 27, 2010

(54) POWER SEMICONDUCTOR COMPONENT HAVING CHIP STACK

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 269 days.

(21) Appl. No.: 11/623,779

(22) Filed: Jan. 17, 2007

(65) Prior Publication Data

US 2007/0176299 A1    Aug. 2, 2007

(30) Foreign Application Priority Data

Jan. 17, 2006    (DE) .................. 10 2006 002 381

(51) Int. Cl.
*H01L 23/043* (2006.01)
(52) U.S. Cl. ................ 257/676; 257/686; 257/E23.085
(58) Field of Classification Search ................ 257/777, 257/676, 686, E23.085
See application file for complete search history.

(56) References Cited

U.S. PATENT DOCUMENTS

| | | | |
|---|---|---|---|
| 6,031,279 A | 2/2000 | Lenz | 257/686 |
| 7,170,160 B1 * | 1/2007 | Wang | 257/686 |
| 7,429,785 B2 * | 9/2008 | Vos | 257/686 |
| 2004/0130021 A1 | 7/2004 | Sridevan | 257/728 |
| 2005/0006743 A1 | 1/2005 | Kim et al. | 257/685 |
| 2005/0082679 A1 | 4/2005 | Otremba | 257/777 |
| 2005/0269695 A1 * | 12/2005 | Brogle et al. | 257/731 |
| 2006/0274561 A1 * | 12/2006 | Ahmed et al. | 363/132 |
| 2006/0290689 A1 * | 12/2006 | Grant et al. | 345/204 |
| 2007/0040260 A1 * | 2/2007 | Otremba | 257/686 |

FOREIGN PATENT DOCUMENTS

| | | |
|---|---|---|
| DE | 19635582 | 2/1988 |
| DE | 10303932 | 3/2004 |
| DE | 10333800 | 10/2004 |
| DE | 102004021054 | 11/2005 |

* cited by examiner

*Primary Examiner*—Wai-Sing Louie
*Assistant Examiner*—Tifney L Skyles
(74) *Attorney, Agent, or Firm*—Banner & Witcoff, Ltd.

(57) ABSTRACT

A power semiconductor component (2) has a chip stack, which contains a first chip (10), a second chip (6) and a third chip (8), where at least the second chip (6) and the third chip (8) are the same height. The power semiconductor component (2) also has a package in which the first chip (10), the second chip (6) and the third chip (8) are placed. The second chip (6) and the third chip (8) are mounted side by side on a lead (4), and the first chip (10) rests both on the second chip (6) and on the third chip (8).

32 Claims, 3 Drawing Sheets

POWER SEMICONDUCTOR COMPONENT HAVING CHIP STACK

RELATED APPLICATION

This application claims priority from German Patent Application No. DE 10 2006 002 381.1, which was filed on Jan. 17, 2006, and is incorporated herein by reference in its entirety.

TECHNICAL FIELD

The invention relates to a power semiconductor component having a chip stack.

BACKGROUND

In some applications of power semiconductors, such as in bridge circuits for motors, a plurality of chips are placed together as a chip stack in a package. This both saves space for the complete system and also reduces the length of interconnects between the chips.

German patent DE 196 35 582 shows such a bridge circuit containing high-side and low-side switches, for which a second chip is mounted on a first chip such that the load paths of the first and second chip are connected in series. The second chip, which lies on top and contains the low-side switch is here designed to be smaller than the first chip, which lies below and contains the high-side switch. This ratio should be inverted, however, in many bridge circuits, for example, because the low-side switch is subject to a far greater load. The current-carrying capability of the power semiconductor component is hence restricted by the size of the low-side switch.

SUMMARY

In a power semiconductor component, the current-carrying capability can be increased compared with conventional solutions.

A power semiconductor component may comprise a chip stack with a first chip, a second chip and a third chip, and may have a package in which the first chip, the second chip and the third chip are placed, wherein the second chip and the third chip lie side by side on a lead, and the first chip is mounted both on the second chip and on the third chip.

BRIEF DESCRIPTION OF THE DRAWINGS

The invention is illustrated in more detail in the drawings with reference to two exemplary embodiments.

DETAILED DESCRIPTION

Figure 1:
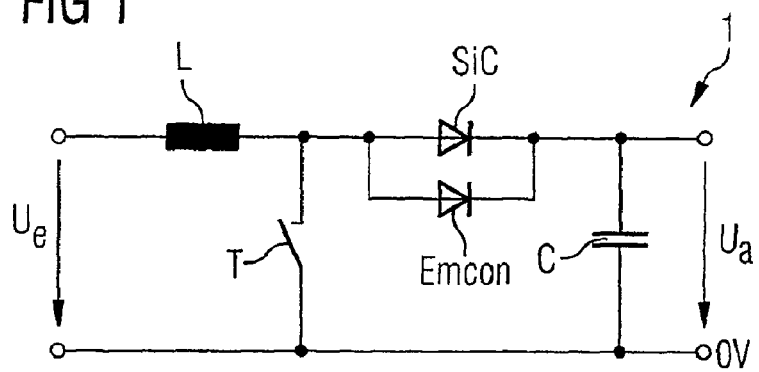
FIG. 1 shows a circuit diagram of an AC/DC converter having devices that are integrated according to an embodiment in a power semiconductor component.

According to an embodiment, a power semiconductor component having a chip stack can be defined, which comprises a first chip, a second chip and a third chip. The first chip, the second chip and the third chip are placed together in a package. The second chip and the third chip lie side by side on a lead. The first chip is mounted both on the second chip and on the third chip.

By supporting on a plurality of chips, the size of the first chip is no longer dependent on the size of the chip lying under it. This is important particularly for power semiconductor components, because the current-carrying capability, i.e. the size of the current that can be conducted through the device, depends on the size of the chip. The heat from the first chip can also be dissipated through the space between the second chip and the third chip in the given arrangement.

In an embodiment, the second chip and the third chip have terminals on their lower face that are electrically connected to the lead lying under them, thereby making a particularly low impedance connection.

According to an embodiment, the second chip and the third chip can be preferably mounted on the lead by means of a diffusion-soldered connection. According to an embodiment, in the diffusion soldering process, a low melting-point solder is converted into a connection that has high thermal stability, with the solder metal forming a thermally stable and mechanically highly stable intermetallic phase with the high melting-point metals to be bonded.

Although a longer soldering time must be provided for diffusion soldering, using the diffusion solder, according to an embodiment, allows the height of the second chip and third chip to be set very precisely because the solder metals are normally applied in very thin layers prior to the actual soldering process. This is important for ensuring the same height of the underlying chips.

According to an embodiment, this is advantageous particularly when using SiC Schottky diodes in the second chip or in the third chip, because SiC Schottky diodes can be operated at a higher temperature than silicon diodes. The use of diffusion soldering results in the advantage that, owing to the high thermal stability of the diffusion-soldered layer, the high thermal stability of the SiC Schottky diodes can also be exploited. The current density allowed through the SiC Schottky diodes can thereby be multiplied several times compared with silicon diodes.

According to an embodiment, the second chip and the third chip preferably have the same thickness in order to ensure a flat support for the first chip. Otherwise intermediate layers would need to be implemented on the second chip or the third chip to equalize the height, which would increase the complexity of assembly.

According to an embodiment, the first chip can be preferably placed symmetrically on the second chip and on the third chip, i.e. the support surfaces of the first chip on the second chip and on the third chip have the same area. This increases the mechanical stability of the whole system, i.e. the power semiconductor component.

According to an embodiment, the size of the first chip can be preferably designed so that the sum of the chip surface areas of the third chip and the second chip is less than the chip surface area of the first chip. The first chip, as the chip with the higher current-carrying capability, can thus be designed to be larger than the sum of the chips lying under it.

According to an embodiment, by integrating identical devices in the second chip and in the third chip respectively, and by connecting these devices in parallel, the first chip can be mounted on a plurality of chips even when the power semiconductor component only contains two device types or two functions, for example just one high-side switch and one low-side switch. According to an embodiment, distributing a device also results in advantages as regards production costs. In theory, distributing a large chip over a plurality of small chips increases the front-end yield, because an individual fault occurring during fabrication only causes failure of a small chip and no longer a large chip.

According to an embodiment, in addition, the devices of the second and third chip can be designed for mutual redundancy, so that when the device of one chip fails, the device of another chip takes on its function.

In one embodiment, contact surfaces are mounted respectively on the lower face of the first chip and on the upper faces of the second chip and third chip. These contact surfaces are connected to the respective devices integrated in the chips. According to an embodiment, the devices are the transistors, diodes or other components that are integrated in the chips. According to an embodiment, the contact surface on the lower face of the first chip is connected at least to one contact surface on the upper face of the second chip and at least to one contact surface of the third chip. This creates direct connections between the devices of the transistors, which reduces the impedance of the connections.

If, on the upper faces of the first chip, the second chip and the third chip, there are contact surfaces which are connected to leads of the power semiconductor component via bonding wires, this chip arrangement according to an embodiment is particularly suitable for power semiconductor components having lead frames, which consist of a multiplicity of leads and which are connected to the chips by a simple assembly process.

According to an embodiment, metal layers between 10 μm and 100 λm high are applied between the contact surfaces lying one above the other. This raises the first chip and reduces the risk of a short-circuit between the edge of the first chip and a bonding wire connecting the upper face of the second chip, because the metal layer raises the contact surfaces of the edge of the first chip above the bonding wire.

According to an embodiment, a PIN diode is integrated in the second chip, a silicon carbide (SiC) Schottky diode in the third chip and a power MOSFET in the first chip. By the first-chip arrangement according to an embodiment, the semiconductor devices of an AC/DC converter can be integrated together in a single power semiconductor component, which reduces the overall size of the AC/DC converter. In this case, the heat from the first chip can also be dissipated advantageously through the space between the second chip and the third chip.

In addition, according to an embodiment, the SiC diode and the PIN diode can be distributed over two chips in each case, so that the power semiconductor component additionally comprises a fourth chip containing a PIN diode and a fifth chip containing a SiC diode. The parts of the diodes are distributed over a plurality of chips so as to distribute the heat generated during operation. It is also possible to distribute the diodes over even more chips, for example over six or eight chips. For example, the yield of SiC single-crystal slices of 89% for a chip surface area of 1 mm² drops to 62% when the semiconductor surface area is tripled. The degree of distribution is limited by the more complex assembly process of the chips, in which care must be taken that these chips are each the same height, even with the larger number of chips.

In another embodiment, a power MOSFET is integrated in the first chip, the second chip and the third chip in each case, where the first MOSFET can be used as a high-side switch and the second MOSFET as a low-side switch. The low-side switch can be designed to be larger than the high-side switch, and hence can carry more current. This power MOSFET can preferably be designed as a compensation device, because compensation devices normally have a high withstand voltage.

According to an embodiment, in a method for fabricating a power semiconductor, initially a second chip and a third chip are mounted side by side on a lead, in fact on the same lead, where care is preferably taken that the second chip and the third chip have the same height. The first chip is then mounted on the second chip and the third chip such that the first chip rests on the second chip and the third chip. In a subsequent process step, contact surfaces located on the upper faces of the first chip, the second chip and the third chip are bonded by means of bonding wires.

The chip stack comprising first chip, second chip and third chip is then encapsulated with a molding compound. By arranging the first chip on underlying second and third chips, the size of the first chip can be designed independently of the chips lying under it. According to an embodiment, in particular, it can be designed to be larger than the chips lying under it. In addition, the heat dissipation from the first chip is improved by providing a space between the second chip and the third chip.

According to an embodiment, preferably there can be a contact surface or a multiplicity of contact surfaces on the lower face of the first chip, which are connected to contact surfaces on the upper faces of the second chip and third chip when the first chip is mounted. This produces direct connections between the first chip and the chips lying under it. These direct connections are short and hence of low impedance.

According to an embodiment, the second chip and the third chip can be advantageously mounted on the lead by means of diffusion soldering in order to ensure the same height of the second and third chips and to obtain a thermally stable soldered connection. This soldered connection preferably also can form the electrical connection between the second chip and/or the third chip and the lead.

FIG. 1 shows a circuit diagram of an AC/DC converter having devices that are integrated according to an embodiment in a power semiconductor component. The circuit 1 is an AC/DC converter, i.e. a circuit that converts an alternating voltage to a direct voltage, which comprises an inductor L, a transistor T, a SiC Schottky diode SiC, a PIN diode Emcon and a capacitor C. The transistor T is shown as a switch having a first terminal and a second terminal. These terminals form the terminals for the load path, for example source and drain. The control input, for example gate terminal or base terminal, of the transistor T is not shown in FIG. 1.

An input voltage $U_e$ is applied to the circuit 1, from which an output voltage $U_a$ is generated by means of the circuit 1. The negative potential of the input voltage $U_e$ and the negative potential of the voltage $U_a$ both lie at 0 V. The positive potential of the input voltage $U_a$ is connected to a first terminal of the inductor L, whose second terminal is connected to a first terminal of the transistor T and to the anode terminals of the PIN diode Emcon and the SiC Schottky diode SiC respectively.

The anode terminals of the diodes Emcon and SiC are connected to the output voltage $U_a$, across which the capacitor C is connected in parallel. A second terminal of the transistor T is connected to the 0 V potential.

The transistor T, which is designed as a compensation power transistor, is driven so that an alternating voltage at the input $U_e$ results in a direct voltage at the output $U_a$. For example, an 800 V alternating voltage is converted into a 400 V direct voltage.

Figure 2:
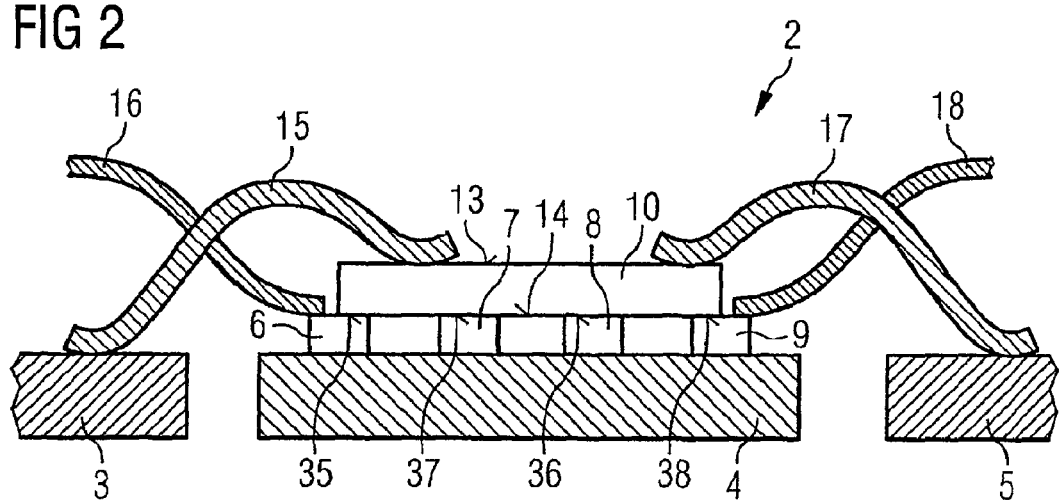
FIG. 2 shows in cross-section a power semiconductor component according to an embodiment for an AC/DC converter as shown in FIG. 1.

FIG. 2 shows in cross-section a section of a power semiconductor component according to an embodiment, in which the components transistor T, PIN diode Emcon and silicon carbide Schottky diode SiC shown in FIG. 1 are placed together in one power semiconductor component 2. The power semiconductor component 2 comprises the leads 3, 4 and 5 arranged side by side, with a second chip 6, a third chip 8, a fourth chip 7 and a fifth chip 9 being arranged side by side on the lead 4 positioned in the center. A first chip 10 rests simultaneously on the second chip 6, the third chip 8, the fourth chip 7 and the fifth chip 9. The chips 10, 6, 8, 7 and 9 thus form a chip stack.

The SiC Schottky diodes SiC are integrated in the second chip 6 and in the fourth chip 7, whilst PIN diodes Emcon are located in the third chip 8 and fifth chip 9 respectively. The SiC Schottky diodes SiC and the PIN diodes Emcon are arranged so that the anode lies at the top and the cathode at the bottom in each case. The SiC Schottky diode SiC from the circuit diagram of FIG. 1 is implemented here by two diodes, which are located in the second chip 6 and in the fourth chip 7 and are connected in parallel. The cathode terminals on the lower face are electrically connected to the lead 4 directly via diffusion-soldered connections lying between the contact terminals for the cathode and the lead 4.

The second chip 6, the third chip 8, the fourth chip 7 and the fifth chip 9 are each the same height, so that the first chip 10 rests simultaneously on the chips 6, 7, 8 and 9. The first chip 10 contains on its upper face 13 a contact surface for the drain and a contact surface for the gate. A contact surface for the source is applied to the lower face 14 of the first chip 10. The contact surface for the source is electrically attached to anode terminals located on the upper faces of the second chip 6, the third chip 8, the fourth chip 7 and the fifth chip 9.

Terminals for the cathode are located on the lower faces of the second chip 6, the third chip 9, the fourth chip 7 and the fifth chip 9. These terminals are electrically connected to the lead 4. The diodes of the second chip 6, the third chip 8, the fourth chip 7 and the fifth chip 9 are thereby connected in parallel.

The bonding wires 15 to 18 are provided for connecting to external pins of the power semiconductor component 2, said bonding wires being connected to the contact surfaces on the upper faces of the second chip 6, the fifth chip 9 and the first chip 10. The bonding wire 15 is here connected to the contact surface for the gate on the upper face 13 of the first chip 10, whilst the bonding wire 16 is connected to the anode terminal of the second chip 6, the bonding wire 17 to the contact surface for the source, and the bonding wire 18 to the anode terminal of the fifth chip 9. The bonding wire 15 is also connected to the lead 3, and the bonding wire 17 to the lead 5.

Since the first chip 10 rests on the other chips 6, 7, 8, 9, the first chip 10, in which the transistor T is integrated, can be designed to be large. The heat dissipation from the chip 1 is improved compared with conventional solutions because the heat is additionally dissipated through the spaces between the second chip 6, the third chip 8, the fourth chip 7 and the fifth chip 9.

Figure 3:
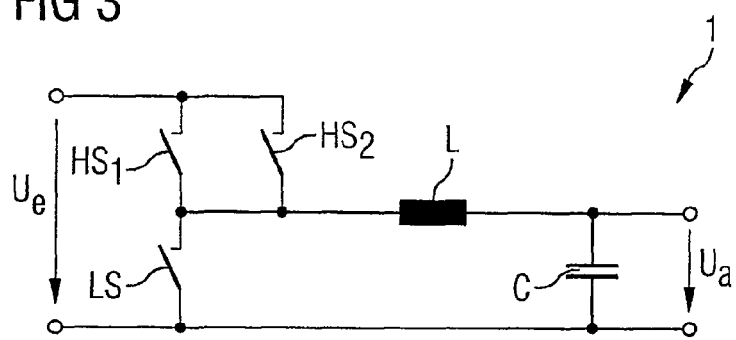
FIG. 3 shows a circuit diagram of a DC/DC converter having devices that are integrated according to an embodiment in a power semiconductor component.

FIG. 3 shows a circuit diagram of a DC/DC converter, which converts an input voltage $U_e$ into an output voltage $U_a$, whose magnitude is less than the input voltage $U_e$. The circuit 30 contains a first transistor $HS_1$, a second transistor $HS_2$ and a third transistor LS, an inductor L and a capacitor C.

The negative potential of the input voltage $U_e$ and that of the output voltage $U_a$ both lie at 0 V. The positive potential of the input voltage $U_e$ is connected to the first terminals of the first transistor $HS_1$ and to the first terminal of the second transistor $HS_2$. The second terminal of the first transistor $HS_1$, and the second terminal of the second transistor $HS_2$ are connected at the node Z and thus connected to a first terminal of the third transistor LS and also to a first terminal of the inductor L. The second terminal of the inductor L is connected to the positive potential of the output voltage $U_a$. The capacitor C is connected in parallel with the output voltage $U_a$.

The control inputs of the transistors $HS_1$, $HS_2$ and LS are not shown in FIG. 3. They control the load paths of the transistors $HS_1$, $HS_2$ and LS such that a voltage of 3 V lies across the output. The transistors $HS_1$ and $HS_2$ are power transistors, for example, and act as high-side switches, and the transistor LS acts as a low-side switch.

The circuit 1 forms a buck converter. To generate an output voltage $U_a$=3V from an input voltage $U_e$=12V, the high-side switches and the low-side switches are switched on and off alternately, for example by pulse width modulation. This produces a voltage at the node Z, which fluctuates, however, owing to the on-off switching actions. These fluctuations are filtered out as far as possible by the inductor L and capacitor C, so that the output voltage $U_a$ is a substantially constant voltage.

Figure 4:
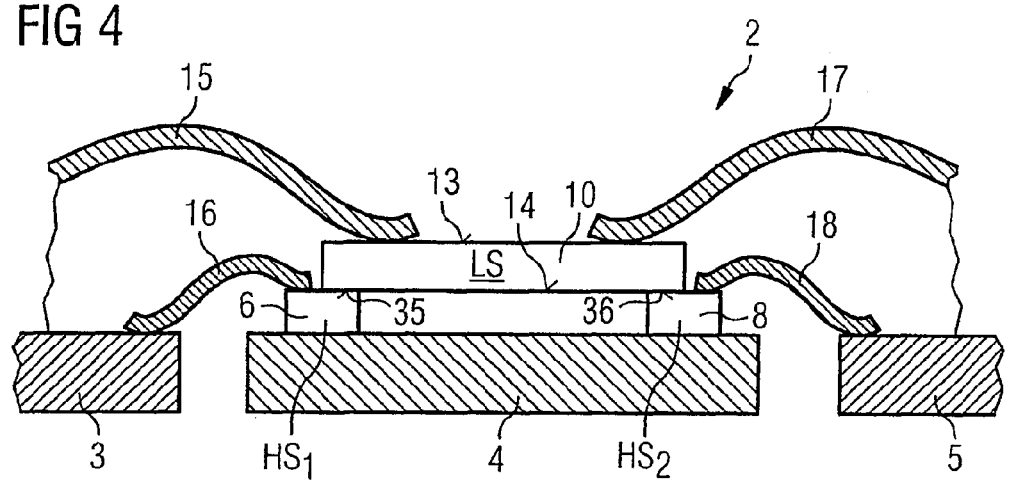
FIG. 4 shows in cross-section a power semiconductor component according to an embodiment for a DC/DC converter as shown in FIG. 3.

FIG. 4 shows in cross-section a section of a power semiconductor component comprising leads 3, 4 and 5 and a first chip 10, a second chip 6, a third chip 8, and bonding wires 15, 16, 17 and 18. Elements having the same functions as in FIG. 2 have the same references and are not described further. The second chip 6 and the third chip 8 are mounted side by side on the lead 4. The second chip 6 contains the transistor $HS_1$, and the third chip 8 contains the transistor $HS_2$. Thus the second chip 6 is additionally denoted by $HS_1$, and the third chip 8 by $HS_2$.

The first chip 10 rests symmetrically on the second chip 6 and the third chip 8 by the support surfaces on the second chip 6 and the third chip 8 each being identical. The first chip 10 contains the transistor LS. The source terminal is connected via the bonding wire 15, and the gate terminal of the transistor LS via the bonding wire 17, both of said terminals being located on the upper face 13 of the first chip 10. A contact surface as terminal for the drain of the transistor LS is located on the lower face 14 of the first chip 10. This drain terminal is electrically connected to contact terminals for the source on the upper faces 35 and 36 of the second chip 6 and the third chip 8.

In addition, on the upper faces 35 and 36 of the second chip 6 and third chip 8 respectively, there are contact terminals for the gate, which are connected via the bonding wires 16 and 18 to the leads 3 and 5 respectively. At least one further bonding wire (not shown in FIG. 4) is taken from a contact terminal for the source on one of the upper faces 35 and 36 to a lead that forms the terminal for the inductor L.

Figure 5:
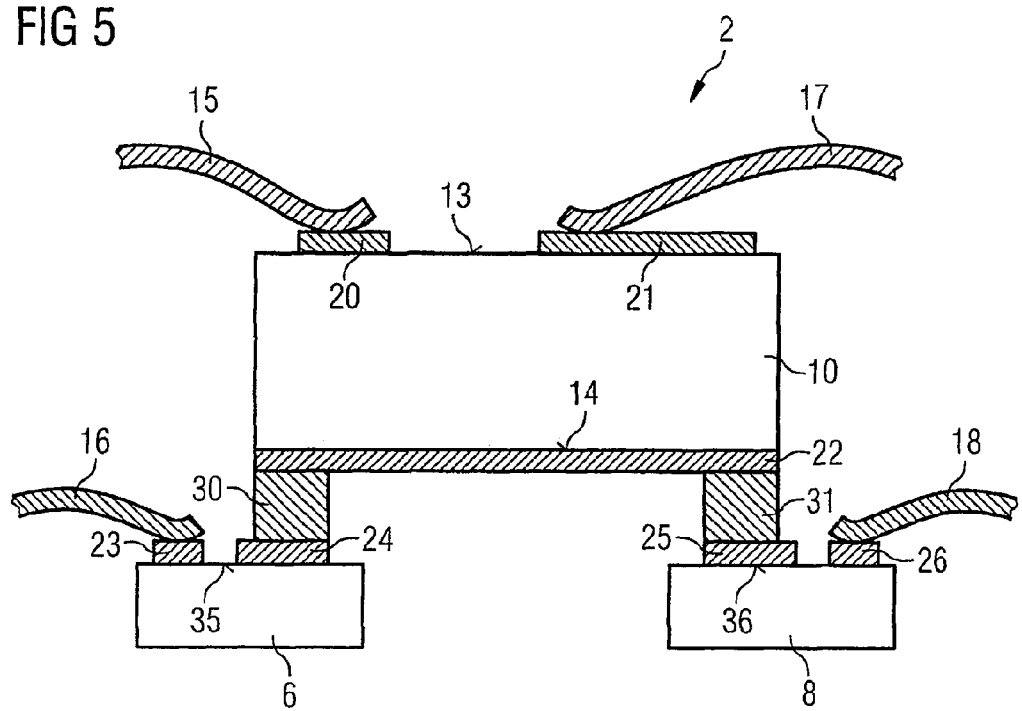
FIG. 5 shows a section of a power semiconductor component according to an embodiment from FIG. 4 containing additional details of the connections between contact surfaces.

FIG. 5 shows details of the power semiconductor component of FIG. 4. Once again the first chip 10, the second chip 6, the third chip 8 and the bonding wires 15, 16, 17 and 18 are shown. Additional details to the diagram in FIG. 4 are also shown of the contact surfaces. The second chip 6 has on its upper face 35 a contact surface for the gate 23 and a contact surface for the source 24. Correspondingly, a contact surface for the gate 26 and a contact surface for the source 25 are located on the upper face 36 of the third chip 8. The metal layers 30 and 31 are applied to the contact surfaces for source 24 and source 25 respectively.

The contact surfaces for the gate 23 and 26 are connected via the bonding wires 16 and 18 respectively to leads not shown here. The first chip 10 has on its upper face 13 a contact surface for the gate 20 and a contact surface for the source 21, which are connected via the bonding wires 15 and 17 to leads of the power semiconductor component 2, which are also not shown here.

On the lower face 14 of the first chip 10, a contact surface for the drain 22 is applied, which is soldered both onto the metal layer 30 and onto the metal layer 31. An electrical connection from the drain of the transistor LS located in the first chip 10 is thereby made to the source of the transistor HS1, located in the second chip 6, via the contact terminal for the drain 22, the intermediate layer 30 and the contact terminal for the source 24. Correspondingly, there is a connection between the drain of the transistor LS located in the first chip 10 to the source of the transistor $HS_2$ located in the third chip 8, via the contact surface for the drain 22, the metal layer 31 and the contact terminal for the source 25.

The metal layers 30 and 31 can be 10 μm to 100 μm high, preferably 50 μm high. They are used to prevent a short-circuit between the gate potentials, applied to the bonding wires 16 and 18 and the connected contact surfaces 23 and 26 respectively, and the potential at the contact surface for the drain 22. Particularly when the first chip 10 is not mounted exactly centrally in the horizontal direction on the second chip 6 and the third chip 8 and thus protrudes laterally, there would be the risk of a short-circuit without the metal layers 30 and 31.

In manufacture, the power semiconductor component is encapsulated by a molding compound after bonding, which after encapsulation forms the package for the power semiconductor component. That part of the molding compound lying between the contact surface for the gate 23 and the intermediate layers 30 and 31 acts as insulation between the gate potential and the source potential.

What is claimed is:

1. A power semiconductor component comprising a chip stack with a first chip, a second chip and a third chip,
    and having a package in which the first chip, the second chip and the third chip are placed,
    wherein the second chip and the third chip lie side by side on a lead, and the first chip is mounted both on the second chip and on the third chip,
    wherein the second chip and the third chip are mounted on the lead by means of a diffusion-soldered connection that includes an intermetallic phase of solder metal with a metal of the lead.

2. The power semiconductor component according to claim 1, wherein the sum of the chip surface areas of the second chip and the third chip is less than the chip surface area of the first chip.

3. The power semiconductor component according to claim 1, wherein the second chip and the third chip each have terminals on their lower face that are electrically connected to the lead lying under them.

4. The power semiconductor component according to claim 1, wherein the first chip is mounted symmetrically on the second chip and on the third chip such that the support surface of the first chip on the second chip is equal in area to the support surface of the first chip on the third chip.

5. The power semiconductor component according to claim 1, wherein at least the second chip and the third chip are the same height.

6. The power semiconductor component according to claim 1, wherein identical devices are integrated in the second chip and in the third chip respectively, and the devices of the second chip and of the third chip are connected in parallel.

7. The power semiconductor component according to claim 1, wherein contact surfaces are located respectively on the lower face of the first chip and on the upper faces of the second chip and third chip, which are connected to the respective electrical devices located in the chip, the contact surface on the lower face of the first chip being electrically connected to at least one contact surface on the upper face of the second chip and to one contact surface on the upper face of the third chip, where the contact surface of the second chip and the contact surface of the third chip are located under the contact surface of the first chip.

8. The power semiconductor component according to claim 1, wherein contact surfaces are located on the upper faces of the first chip, the second chip and the third chip, which are connected to leads of the power semiconductor component via bonding wires.

9. The power semiconductor component according to claim 1, wherein metal layers, each 10 μm to 100 μm high, are placed between a contact surface on a lower face of the first chip and a contact surface on an upper face of the second chip and between the contact surface on the lower face of the first chip and a contact surface on an upper face of the third chip.

10. The power semiconductor component according to claim 1, wherein a PIN diode is integrated in the second chip and a SiC Schottky diode is integrated in the third chip.

11. The power semiconductor component according to claim 10, wherein the power semiconductor component additionally comprises a fourth chip and a fifth chip, where the fourth chip and the fifth chip contain PIN diodes, which are connected in parallel with each other and in parallel with the second chip and the third chip, and where the first chip is also mounted on the fourth chip and the fifth chip.

12. The power semiconductor component according to claim 10, wherein the power semiconductor component is part of an AC/DC converter having a power transistor and having two parallel-connected diodes, in which the power transistor is implemented in the first chip and the diodes in the second chip and in the third chip.

13. The power semiconductor component according to claim 1, wherein power MOSFETs are integrated in the first chip, the second chip and the third chip in each case.

14. The power semiconductor component according to claim 13, wherein the power semiconductor component is part of a DC/DC converter having a high-side switch and a low-side switch, in which the low-side switch is implemented by the power MOSFET of the first chip and the high-side switch by the parallel-connected power MOSFETs of the second chip and the third chip.

15. A power semiconductor component comprising a chip stack with a first chip, a second chip and a third chip, wherein the first chip is a power transistor device,
    and having a package in which the first chip, the second chip and the third chip are placed,
    wherein the second chip and the third chip lie side by side on a lead, and the first chip is mounted both on the second chip and on the third chip, and
    wherein the first chip is mounted symmetrically on the second chip and on the third chip such that a support surface of the first chip on the second chip is equal in area to a support surface of the first chip on the third chip.

16. A power semiconductor component comprising a chip stack with a first chip, a second chip and a third chip,
    and having a package in which the first chip, the second chip and the third chip are placed,
    wherein the second chip and the third chip lie side by side on a lead, and the first chip is mounted both on the second chip and on the third chip, and wherein contact surfaces located on an upper face of the first chip are connected to leads of the power semiconductor component via bonding wires.

17. The power semiconductor component according to claim 16, wherein the sum of the chip surface areas of the second chip and the third chip is less than the chip surface area of the first chip.

18. The power semiconductor component according to claim 16, wherein the second chip and the third chip each have terminals on their lower face that are electrically connected to the lead lying under them.

19. The power semiconductor component according to claim 16, wherein the first chip is mounted symmetrically on the second chip and on the third chip such that the support surface of the first chip on the second chip is equal in area to the support surface of the first chip on the third chip.

20. The power semiconductor component according to claim 16, wherein at least the second chip and the third chip are the same height.

21. The power semiconductor component according to claim 16, wherein identical devices are integrated in the second chip and in the third chip respectively, and the devices of the second chip and of the third chip are connected in parallel.

22. The power semiconductor component according to claim 16, wherein contact surfaces are located respectively on the lower face of the first chip and on the upper faces of the second chip and third chip, which are connected to the respective electrical devices located in the chip, the contact surface on the lower face of the first chip being electrically connected to at least one contact surface on the upper face of the second chip and to one contact surface on the upper face of the third chip, where the contact surface of the second chip and the contact surface of the third chip are located under the contact surface of the first chip.

23. The power semiconductor component according to claim 16, wherein contact surfaces are located on the upper faces of the first chip, the second chip and the third chip, which are connected to leads of the power semiconductor component via bonding wires.

24. The power semiconductor component according to claim 16, wherein metal layers, each 10 μm to 100 μm high, are placed between a contact surface on a lower face of the first chip and a contact surface on an upper face of the second chip and between the contact surface on the lower face of the first chip and a contact surface on an upper face of the third chip.

25. The power semiconductor component according to claim 16, wherein a PIN diode is integrated in the second chip and a SIC Schottky diode is integrated in the third chip.

26. The power semiconductor component according to claim 25, wherein the power semiconductor component additionally comprises a fourth chip and a fifth chip, where the fourth chip and the fifth chip contain PIN diodes, which are connected in parallel with each other and in parallel with the second chip and the third chip, and where the first chip is also mounted on the fourth chip and the fifth chip.

27. The power semiconductor component according to claim 25, wherein the power semiconductor component is part of an AC/DC converter having a power transistor and having two parallel-connected diodes, in which the. power transistor is implemented in the first chip and the diodes in the second chip and in the third chip.

28. The power semiconductor component according to claim 16, wherein power MOSFETs are integrated in the first chip, the second chip and the third chip in each case.

29. The power semiconductor component according to claim 28, wherein the power semiconductor component is part of a DC/DC converter having a high-side switch and a low-side switch, in which the low-side switch is implemented by the power MOSFET of the first chip and the high-side switch by the parallel-connected power MOSFETs of the second chip and the third chip.

30. The power semiconductor component of claim 15, wherein contact surfaces located on an upper face of the first chip are connected to leads of the power semiconductor component via bonding wires.

31. The power semiconductor component of claim 15, wherein power MOSFETs are integrated in each of the first chip, the second chip and the third chip.

32. The power semiconductor component of claim 31, wherein the power semiconductor component is part of a DC/DC converter having a high-side switch and a low-side switch, in which the low-side switch is implemented by the power MOSFET of the first chip and the high-side switch by the parallel-connected power MOSFETs of the second chip and the third chip.

* * * * *